United States Patent
Shanbhogue et al.

(10) Patent No.: US 9,185,822 B2
(45) Date of Patent: Nov. 10, 2015

(54) THERMAL DISSIPATION TECHNIQUES FOR MULTI-SENSORY ELECTROMECHANICAL PRODUCTS PACKAGED IN SEALED ENCLOSURES

(75) Inventors: Shridhara Shanbhogue, Bangalore (IN); ShanoPrasad Kunjappan, Bangalore (IN); Ashutosh Kumar Pandey, Bangalore (IN); ArulSelvam Arumugam, Bangalore (IN); Ramkrishna U. Pal, Bangalore (IN); Dathathreya Durgadhahalli Ganesh, Bangalore (IN)

(73) Assignee: Honeywell International, Inc., Morristown, NJ (US)

( * ) Notice: Subject to any disclaimer, the term of this patent is extended or adjusted under 35 U.S.C. 154(b) by 528 days.

(21) Appl. No.: 13/493,792

(22) Filed: Jun. 11, 2012

(65) Prior Publication Data

US 2013/0329356 A1     Dec. 12, 2013

(51) Int. Cl.
| | |
|---|---|
| G06F 1/16 | (2006.01) |
| H05K 5/00 | (2006.01) |
| H05K 7/20 | (2006.01) |
| H05K 7/14 | (2006.01) |
| H05K 1/14 | (2006.01) |
| H05K 9/00 | (2006.01) |

(52) U.S. Cl.
CPC ............. H05K 7/142 (2013.01); H05K 1/144 (2013.01); H05K 7/20409 (2013.01); H05K 5/0026 (2013.01); H05K 9/0083 (2013.01); H05K 2203/1355 (2013.01)

(58) Field of Classification Search
CPC ..... H05K 1/144; H05K 1/145; H05K 5/0026; H05K 5/003; H05K 5/0034; H05K 5/0043; H05K 5/0047; H05K 5/0052; H05K 5/006; H05K 5/0065; H05K 5/0078; H05K 9/0083; H05K 2203/1355
USPC ............ 361/679.47, 736, 742, 748, 752, 760, 361/761, 762, 767, 770, 771, 785, 790, 796, 361/803, 804, 818, 679.46, 679.54, 688, 361/704–723; 34/210, 212; 386/117, 126; 307/89, 91
See application file for complete search history.

(56) References Cited

U.S. PATENT DOCUMENTS

| | | | |
|---|---|---|---|
| 3,611,046 A | 10/1971 | Covert | |
| 5,768,109 A * | 6/1998 | Gulick et al. | 361/794 |

(Continued)

OTHER PUBLICATIONS

Product Specification, "BDN IP67 Diecast Aluminium Box", Takachi, 2010, pp. 139-144.

(Continued)

*Primary Examiner* — Courtney Smith
*Assistant Examiner* — Zhengfu Feng
(74) *Attorney, Agent, or Firm* — Craige Thompson; Thompson Patent Law

(57) ABSTRACT

In general, the disclosure is directed to sealed enclosures and devices that include enclosures for protecting enclosed heat sensitive components from the heat generated by enclosed heat producing components. Heat producing components within the enclosure may be placed to achieve uniform distribution of heat produced by the heat producing components, to optimize the dissipation of heat from the heat producing components to the enclosure, and to minimize the heat experienced by the heat sensitive components. The exterior of the enclosure may be designed to increase thermal dissipation and to protect against thermal radiation.

17 Claims, 7 Drawing Sheets

(56) References Cited

U.S. PATENT DOCUMENTS

| | | | |
|---|---|---|---|
| 6,165,612 A | 12/2000 | Misra | |
| 6,400,044 B1* | 6/2002 | Lohberg et al. | 307/91 |
| 7,057,306 B2 | 6/2006 | Belschner et al. | |
| 7,687,725 B2 | 3/2010 | Hogan | |
| 2005/0084252 A1* | 4/2005 | Satou et al. | 386/126 |
| 2008/0310086 A1* | 12/2008 | Akama et al. | 361/679 |
| 2009/0183912 A1* | 7/2009 | Hogan | 174/377 |
| 2011/0292624 A1* | 12/2011 | Tanaka et al. | 361/752 |

OTHER PUBLICATIONS

Product Specification, "Operator Interface Enclosure," Hoffman Enclosures Inc., 2009, pp. 1316-1367.

\* cited by examiner

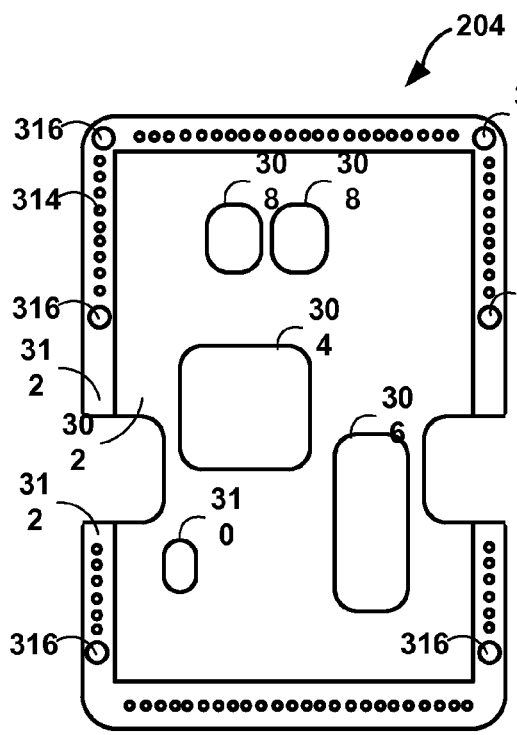 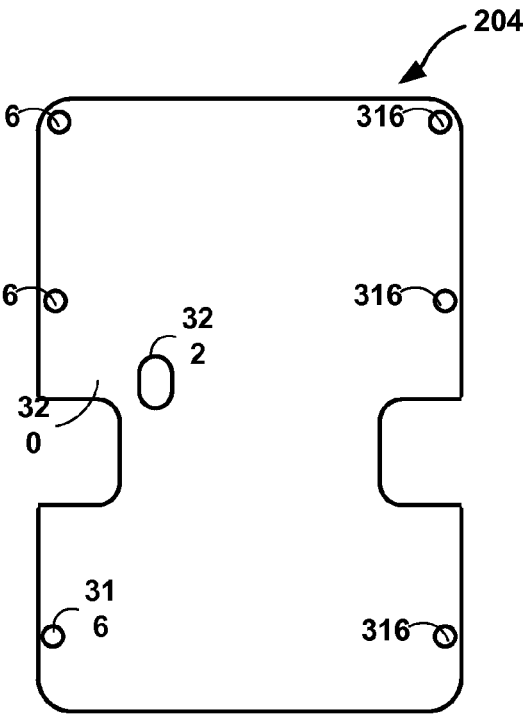
FIG. 3A          FIG. 3B
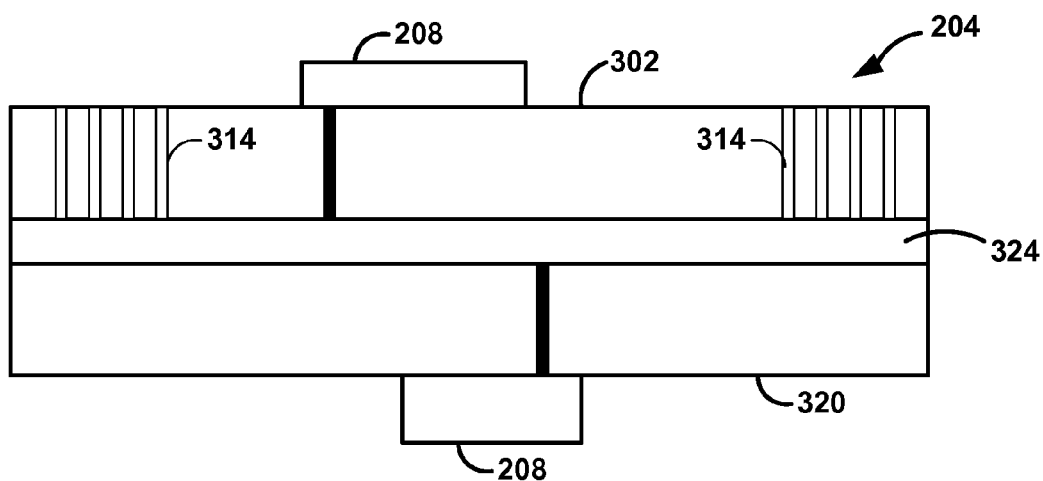
FIG. 3C

THERMAL DISSIPATION TECHNIQUES FOR MULTI-SENSORY ELECTROMECHANICAL PRODUCTS PACKAGED IN SEALED ENCLOSURES

TECHNICAL FIELD

The disclosure relates to a mechanical enclosure, and more specifically relates to a substantially sealed enclosure that encloses electromechanical components.

BACKGROUND

Sensitive electronic components may be protected from harsh operating environments by being enclosed in a substantially air-proof and dust-proof enclosure. For example, in an automotive application, the sensitive electronic components may be subject to harsh vibrations, high temperatures, and environmental contaminants such as dirt, oil, fluids, and the like. While the enclosure keeps contaminants away from the enclosed sensitive electronic components by being substantially sealed, the sealed design of the enclosures may also trap in the heat produced by the enclosed electronic components such as microprocessors and high speed memory.

SUMMARY

In general, this disclosure is directed towards protecting heat sensitive components in a substantially sealed enclosure from the heat generated by heat producing components that are also within the enclosure. Because the enclosure is substantially sealed, convectional heat dissipation techniques such as fan cooling cannot efficiently dissipate heat generated by the heat producing components. Direct heat extraction from a printed circuit board to the enclosure without thermal pads is also not used because reverse current generated during welding of the enclosure can damage the heat sensitive components through ground plane shorting. In addition, heat pipes are also not used because enclosures that include heat pipes are unlikely to pass stringent vibration and drop tests. Instead, heat producing components may be placed within the enclosure to optimally distribute the heat produced by the heat producing components, to optimize the transfer of heat from the heat producing components to the enclosure, and to minimize the heat experienced by the heat sensitive components. Furthermore, the exterior of the enclosure may be designed to increase thermal dissipation and to protect against thermal radiation.

In one aspect, the disclosure is directed to a device. The device may include an anodized and substantially sealed enclosure, the enclosure including a powder coated exterior, the exterior of the enclosure including a plurality of fins. The device may further include a first printed circuit board disposed within an interior and substantially parallel to a first surface in the interior of the enclosure. The device may further include one or more first heat producing components operably coupled to the first printed circuit board. The device may further include one or more first gap filler thermal pads disposed between the one or more first heat producing components and one or more first portions of the first surface in the interior of the enclosure. The device may further include one or more heat sensitive components disposed within the interior of the enclosure. The one or more first heat producing components in the device may be disposed on a first surface of the first printed circuit board facing away from the one or more heat sensitive components and facing towards the first surface in the interior of the enclosure.

In another aspect, the disclosure is directed to an enclosure. The enclosure may include an exterior that is anodized and includes a powder coating. The enclosure may further include an interior that is anodized. The enclosure may further include a plurality of fins extending out from the exterior. The enclosure may further include a plurality of heat sensitive components disposed within the enclosure. The enclosure may further include a plurality of first heat producing components disposed within the enclosure, wherein the plurality of first heat producing components are disposed closer to a first portion of the interior than the heat sensitive component. The enclosure may further include a plurality of second heat producing components within the enclosure, wherein the plurality of second heat producing components are disposed closer to a second portion of the interior than the heat sensitive components, wherein the second portion of the interior is substantially parallel to the first portion of the interior. The enclosure may be substantially sealed.

The details of one or more aspects of the disclosure are set forth in the accompanying drawings and the description below. Other features, objects, and advantages of the disclosure will be apparent from the description and drawings, and from the claims.

BRIEF DESCRIPTION OF DRAWINGS

FIGS. 3A-3B are plan views illustrating an example processor board according to aspects of the disclosure.

FIG. 3C is a cross-section view illustrating an example processor board according to aspects of the disclosure.

DETAILED DESCRIPTION

Figure 1A:
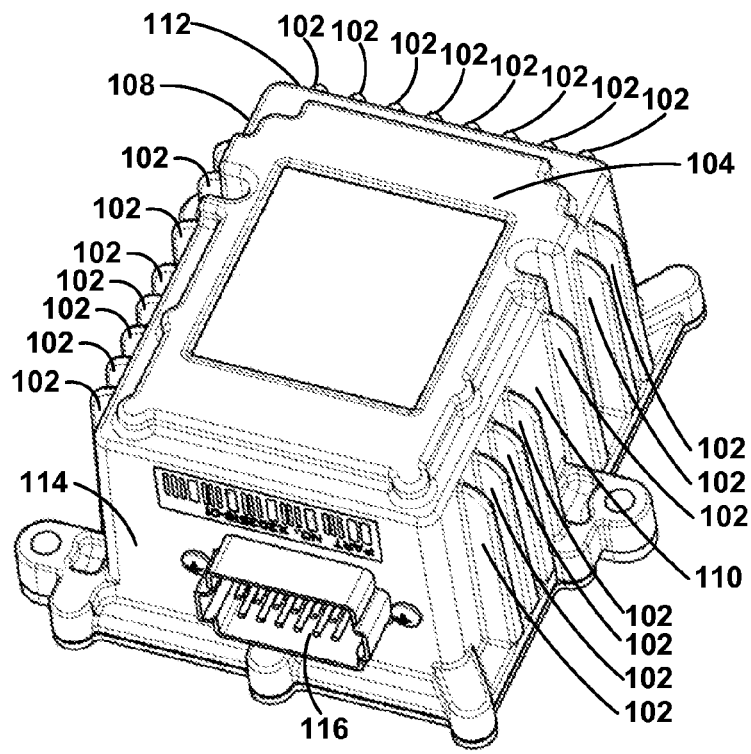
FIG. 1A is perspective view illustrating the exterior of an example enclosure according to aspects of the disclosure.
Figure 1B:
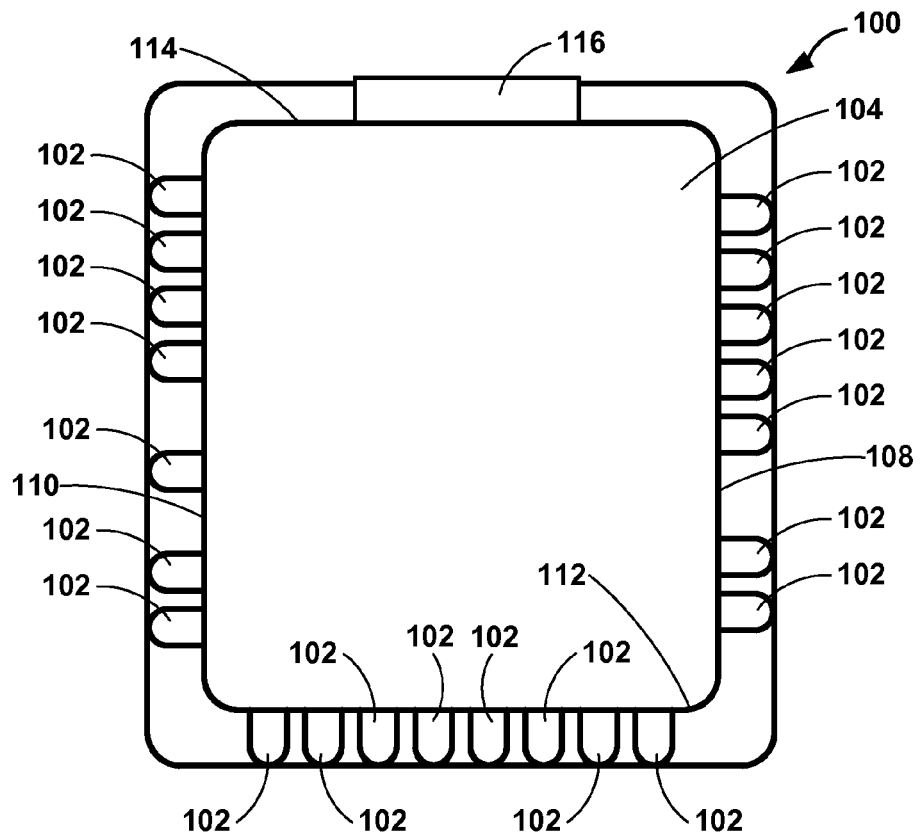
FIG. 1B is a plan view illustrating the exterior of an example enclosure according to some aspects of the disclosure.
Figure 1C:
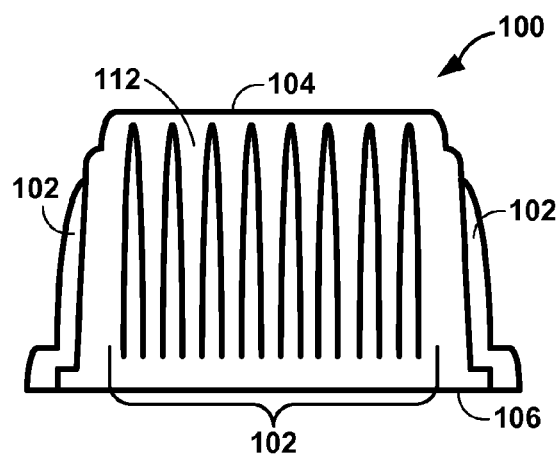
FIGS. 1C-1E are elevation views illustrating the exterior of an example enclosure according to some aspects of the disclosure.
Figure 1D:
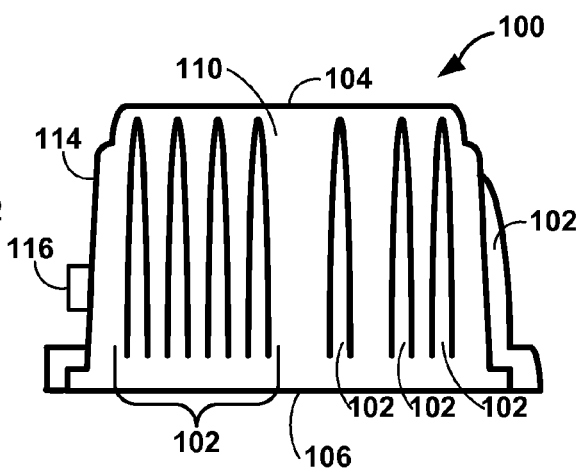
Figure 1E:
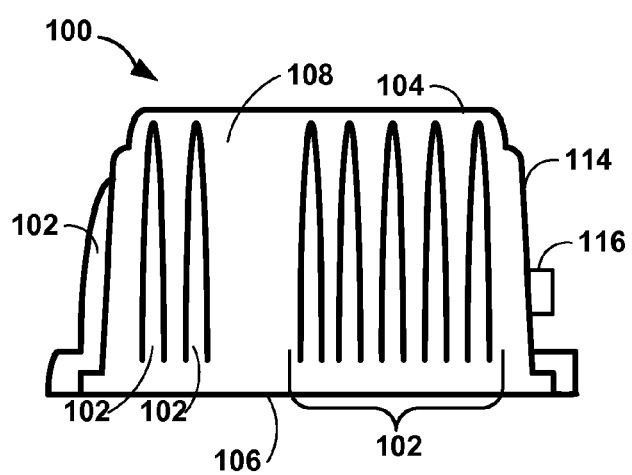

FIG. 1A is perspective view illustrating the exterior of an example enclosure according to aspects of the disclosure. FIG. 1B is a plan view illustrating the exterior of an example enclosure according to some aspects of the disclosure. FIGS. 1C-1E are elevation views illustrating the exterior of an example enclosure according to some aspects of the disclosure. As shown in FIGS. 1A-1E, enclosure 100 may be a substantially rectangular shaped mechanical enclosure that houses electronic components. Enclosure 100 may be substantially sealed, such as by being substantially dust-proof, air-proof, and waterproof and/or by meeting the requirement of IP69K or IP67K ratings as defined by the International Electrotechnical Commission (IEC) 60529 standard, the Deutsches Institut für Normung (DIN) 40050-9 standard, and/or the National Electrical Manufacturers Association (NEMA) standard. These standards may rate the degrees of protection provided against the intrusion of solid objects, dust, accidental contact, and water in mechanical and electrical enclosures. In other examples, techniques of this disclosure may also be applicable to non-seal-proof and/or non-IP67K and non-IP69K enclosure applications. In some examples, enclosure 100 may house one or more sensors and may be used in automotive applications in environments with temperatures of 85° C. and higher, and may also be required to meet specified electrostatic discharge, electromagnetic interference, and electromagnetic compatibility criteria.

The exterior of enclosure 100 may act as a heat sink by incorporating thermal dissipation features that aids the dissipation of heat produced by the heat producing components such as processors and high speed memory enclosed by enclosure 100, so that heat sensitive components such as micro-electromechanical systems (MEMS) sensors or other heat sensitive electromechanical components in enclosure 100 remain in an optimal operating temperature range. In some examples, enclosure 100 is a metal enclosure, such as an aluminum alloy enclosure, that is anodized on both its interior and exterior surfaces. In some examples, enclosure 100 is completely anodized. Anodizing enclosure 100 increases thermal dissipation through enclosure 100 and increases thermal conductivity of heat from enclosure 100 to the operating environment. The exterior of enclosure 100 may also be powder coated with a white powder coating over the anodized aluminum. In such examples, the power coating protects enclosure 100 against electrostatic discharge, while the white color of the powder coating protects enclosure 100 against thermal radiation from heat sources in the operating environment of enclosure 100. The weight of the powder coating may be negligible compared to the weight of enclosure 100.

Enclosure 100 may include fins 102. Fins 102 may increase the surface area exterior to enclosure 100, thereby decreasing thermal resistance of enclosure 100 and increasing thermal dissipation by enclosure 100 due to the additional surface area provided by fins 102. As can be seen, enclosure 100 may be a substantially rectangular enclosure, and fins 102 may extend out of one or more exterior surfaces of enclosure 100, such as sides 108, 110, and 112 of enclosure 100. Fins 102 may be made of metal, such as aluminum alloy, may be parabolic in shape, and may each have an adiabatic tip (e.g. a completely insulated tip). Like enclosure 100, fins 102 may also be anodized and powder coated with a white color. The weight of fins 102 may be negligible compared to the weight of enclosure 100. In some examples, enclosure 100 includes twenty-two fins 102 that extend out of three exterior surfaces 108, 110, and 112 of enclosure 100, but do not extend out of top surface 104 and bottom surface 106 or surface 114 of enclosure 100, and are substantially parallel to each other. Each of the twenty-two fins 102, in some examples, may be 49 millimeters tall, 3.75 millimeters wide, and may extend 7 millimeters from sides 108 110, and 112, and may achieve an overall fin efficiency of about 41.3% and a total heat dissipation through the twenty-two fins 102 of about 4.44 watts. Connector 116 may extend out of surface 114 of enclosure 100.

Figure 2A:
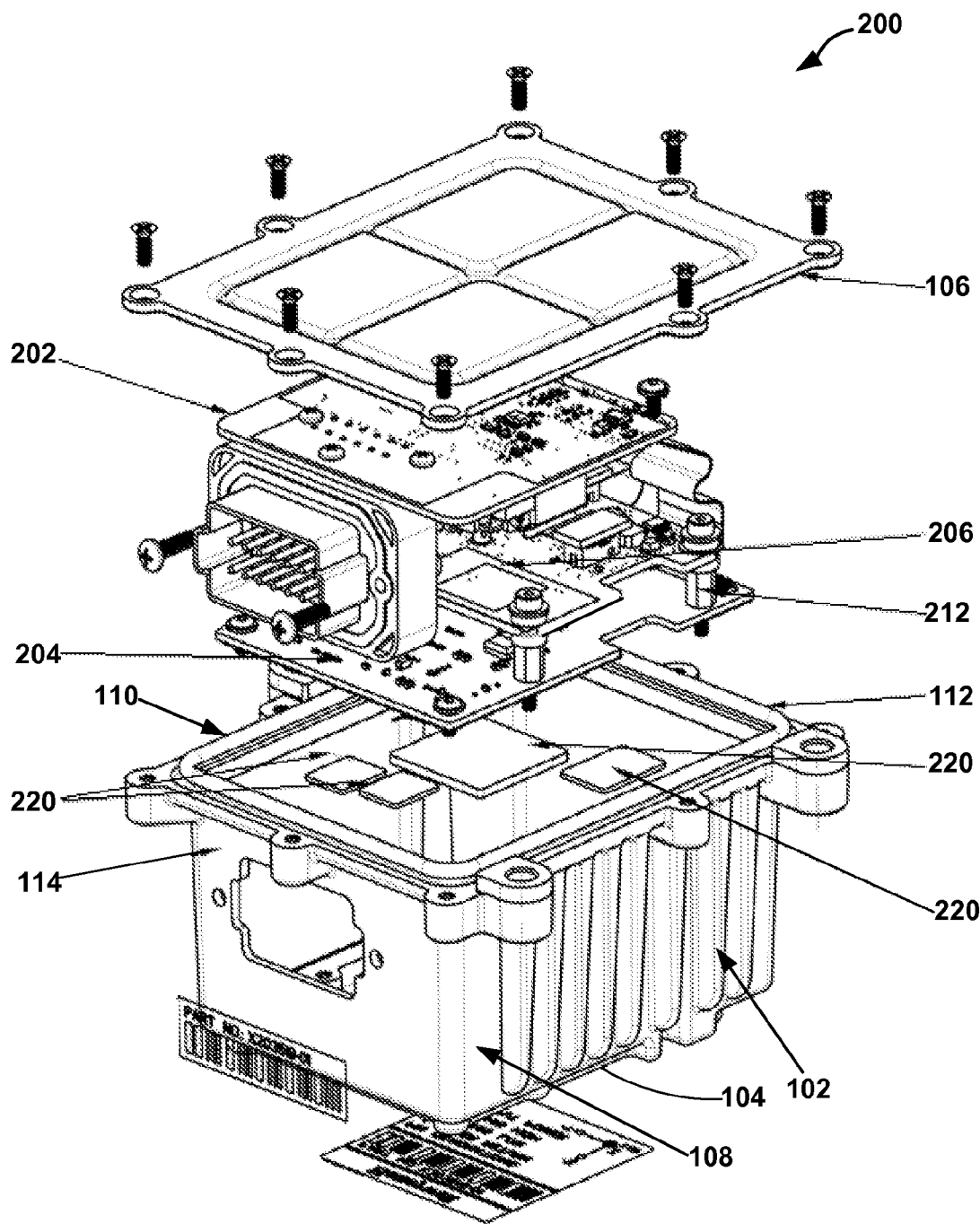
FIG. 2A is an exploded perspective view illustrating an example enclosure according to aspects of the disclosure.
Figure 2B:
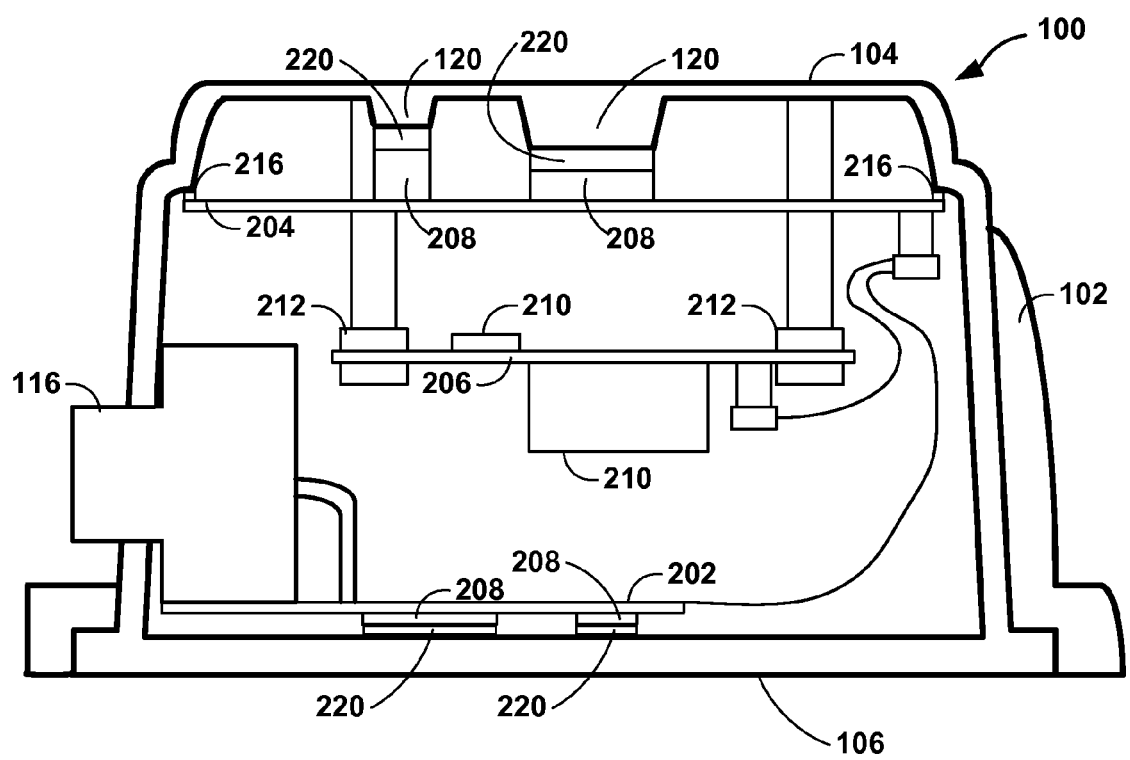
FIG. 2B is a cross-section view illustrating an example enclosure according to aspects of the disclosure.

FIG. 2A is an exploded perspective view illustrating an example enclosure according to aspects of the disclosure. FIG. 2B is a cross-section view illustrating an example enclosure according to aspects of the disclosure. As shown in FIGS. 2A and 2B, enclosure 100 may include bottom surface 106 and top surface 104 opposite to bottom surface 106, and the interior surface of top surface 104 may be opposite and substantially parallel to the interior surface of bottom surface 106. Similar to the exterior surface of enclosure 100, the interior surface of enclosure 100 may also be anodized. Enclosure 100 may include heat producing components 208 and heat sensitive components 210, so that heat producing components may be disposed within enclosure 100 closer to the interior surface of either top surface 104 or bottom surface 106 than heat sensitive components 210.

Enclosure 100 may enclose power supply board 202, processor board 204, and sensor board 206. Heat producing components 208 are operably coupled to power supply board 202 and processor board 204, while heat-sensitive components 210 are operably coupled to sensor board 206. Power supply board 202, processor board 204, and sensor board 206 may be printed circuit boards and may be disposed substantially parallel to top surface 104 and bottom surface 106 of enclosure 100.

Heat producing components 208 operably coupled to power supply board 202 may include a computer automotive network transceiver, a low dropout regulator, diodes, transistors, a DC-DC converter, and the like. Power supply board 202 may also include a connector 116. Heat producing components 208 operably coupled to processor board 204 may include processors, memory, a power management integrated circuit, a low drop out regulator, and the like. Heat sensitive components 210 operably coupled to sensor board 206 may include one or more gyroscopes, an accelerometer, a magnetometer, and the like. Sensor board 206 may also include dampers 212, such as elastomeric dampers, that are coupled to enclosure 100 to dampen the vibration felt by heat sensitive components 210 on sensor board 206 and to further isolate those components 210 from heat generating components 208.

As can be seen, sensor board 206 may be disposed between power supply board 202 and processor board 204. Power supply board 202 is disposed closer to the interior surface of bottom surface 106 within the interior of enclosure 100 than sensor board 206, and processor board 204 is disposed closer to the interior surface of top surface 104 in the interior of enclosure 100 than sensor board 206. In some example, power supply board 202 may be closer to the interior surface of bottom surface 106 than power supply board 202 is to sensor board 206, and processor board 204 may be closer to the interior surface of top surface 104 than processor board 204 is to sensor board 206.

Heat producing components 208 operably coupled to power supply board 202 and processor board 204 may be disposed on the respective surfaces of power supply board 202 and processor board 204 facing away from sensor board 206, so that the heat producing components 208 face towards interior surfaces of enclosure 100. For example, the heat producing components 208 of power supply board 202 may face towards the interior surface of bottom surface 106 of enclosure 100, while the heat producing components 208 of processor board 204 may face towards the interior of top surface 104 of enclosure 100.

Edges of power supply board 202 and processor board 204 may abut portions of the interior surface of enclosure 100, and those boards may also be clamped to enclosure 100, while sensor board 206 is not clamped to enclosure 100. Thermal pads 216, such as silicon thermal pads, may be disposed between enclosure 100 and the edges of power supply board 202 and processor board 204 to extract heat from power supply board 202 and processor board 204, and to electrically insulate power supply board 202 and processor board 204 from contact with surfaces of enclosure 100, thereby preventing possible problems such as damaging the components disposed on power supply board 202 and processor board 204 due to, for example, ground plane shorting. Thus, thermal pads 216 may be disposed between conductive material on the surfaces of processor board 204 and power supply board 202 and portions of the interior of enclosure 100.

Gap filler thermal pads 220, such as silicon gap filler thermal pads, may be disposed between heat producing components 208 facing an interior surface of enclosure 100 and one or more portions of that surface in the interior of enclosure 100, to directly extract heat from those heat producing components 208 to the environment via enclosure 100. For example, gap filler thermal pad 220 may be disposed between heat producing components 208 disposed on processor board 204 and a portion of top surface 104 of enclosure 100, and between heat producing components 208 disposed on power supply board 204 and a portion of bottom surface 106 of enclosure 100.

Gap filler thermal pads 220 may be compressed by about 40% between heat producing components 208 and the portion of the interior surface of top surface 104 to achieve optimal thermal transfer from the heat producing components 208 to enclosure 100. To ensure uniform compression of the thermal pads, the interior surfaces of enclosure 100, such as the interior surfaces of top surface 104 and bottom surface 106 may include protrusions 120 of variable height, so that gap filler thermal pads 220 disposed between those protrusions 120 and heat producing components 220 of different heights can be equally compressed by about 40%. Thermal pads 216 and gap filler thermal pads 220 may also enhance vibration damping of processor board 204 and power supply board 202.

FIGS. 3A-3B are plan views illustrating an example processor board according to aspects of the disclosure. FIG. 3C is a cross-section view illustrating an example processor board according to aspects of the disclosure. As shown in FIG. 3A, processor board 206 may be a printed circuit board (PCB) and may include fastening points 316 where processor board 206 is mounted to enclosure 100. Processor board may include surface 302, which may be the surface of processor board 204 that faces the interior surface of top surface 104 of enclosure 100. Heat producing components such as processor 304, flash memory 306, double data rate (DDR) memory 308, and power management integrated circuit (PMIC) 310 may be disposed on surface 302. Processor 304, flash memory 306, DDR memory 304, and PMIC 310 may be arranged on surface 302 to evenly distribute the heat produced by those components and to optimize the placement of hot spots.

Surface 302 of processor board 204 may also include thermal pads 312. Thermal pads 312 may include thermal pads 216 and may be disposed on surface 302 on top of exposed conductive material, such as exposed copper (not shown), so that thermal pads 312 may conduct the heat from the exposed conductive material to enclosure 100. Thermal pads 312 may also provide enhanced vibration damping of processor board 204. Surface 302 may also include holes 314 that may be filled with thermal epoxy to connect the exposed copper to a ground plane (not shown) for processor board 204. Similar to gap filler thermal pads, such as gap filler thermal pad 220 shown in FIG. 2, thermal pads 312 may also be compressed by about 20% near fastening points 316 to optimize heat transfer to enclosure 100.

As shown in FIG. 3B, processor board 204 may include surface 320 on the opposing side of processor board 204 from surface 302. As can be seen, mounting points 316 may be hollow areas of processor board 204, so they may carry through both surface 302 and surface 320 of processor board 204. Although surface 320 may face towards sensor board 206 and heat sensitive components 210, one or more heat producing components, such as low dropout (LDO) regulator 322 may be disposed on surface 302. Heat generating components disposed on surface 320 of processor board 204 may generally produce much less heat than heat generating components disposed on surface 302, such as processor 304, and thus may only have less effect on the temperature of heat sensitive components 210.

As shown in FIG. 3C, processor board 204 may include a ground plane 324 between surface 302 and surface 320. Ground plane 324 may be made of copper and may appear as an infinite ground potential to signals. Heat producing components 208 on surface 302 and surface 320 may directly connect to ground plane 324, while holes 314 filled with thermal epoxy may connect exposed conductive material on surface 302 to ground plane 324.

Figure 4A:
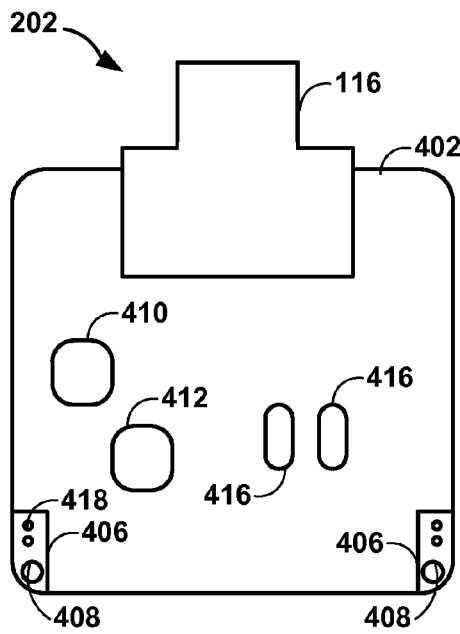
FIGS. 4A-4B are plan views illustrating an example power supply board according to aspects of the disclosure.
Figure 4B:
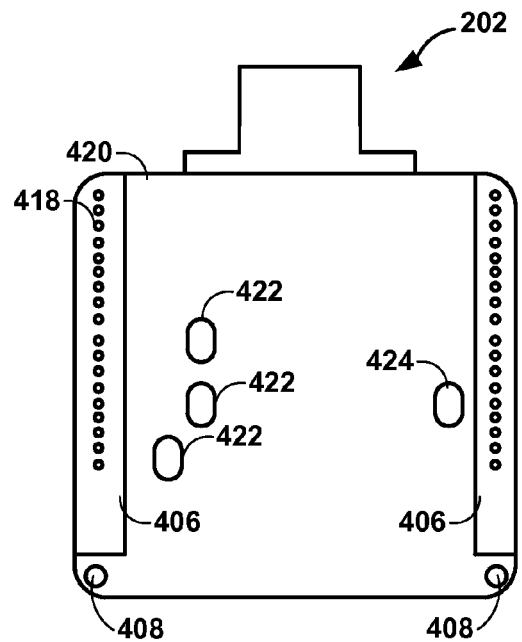
Figure 4C:
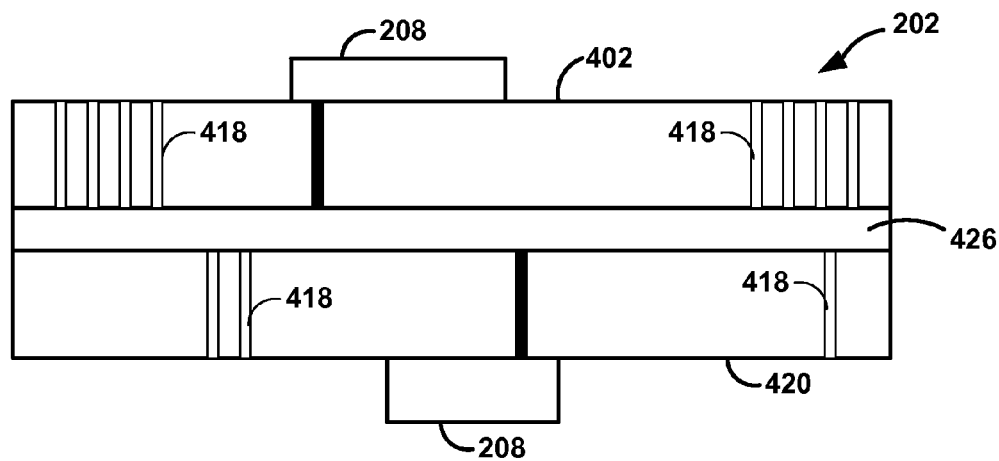
FIG. 4C is a cross-section view illustrating an example power supply board according to aspects of the disclosure.

FIGS. 4A-4B are plan views illustrating an example power supply board according to aspects of the disclosure. FIG. 4C is a cross-section view of an example power supply board according to aspects of the disclosure. As shown in FIG. 4A, power supply board 202 may be a printed circuit board and may include fastening points 408 where power supply board 202 is mounted to enclosure 100. Power supply board 202 may include surface 402, which may be the surface of power supply board 204 that faces away from the interior surface of bottom surface 106 of enclosure 100, and faces towards sensor board 206 when power supply board 202 is mounted in enclosure 100. Heat producing components such as catch diode 410, DC-DC converter 412, and MOSFET diodes 416 may be disposed on surface 402. Although these heat producing components face towards sensor board 206 when mounted in enclosure 100, these heat producing components may produce less heat than the heat producing components on the opposite surface of power supply 202.

Thermal pads 406 may also be disposed on surface 402 over exposed conductive material (not shown), so that thermal pads 406 may conduct the heat from those exposed conductive material to enclosure 100. Thermal pads 406 may also provide enhanced vibration damping of power supply board 202. Surface 402 may also include holes 418 that may be filled with thermal epoxy to connect the exposed conductive material to a ground plane (shown in FIG. 4C) for power supply board 406. Similar to gap filler thermal pads, such as gap filler thermal pad 220 shown in FIG. 2, thermal pads 406 may also be compressed by about 40% near fastening points 408 to optimize heat transfer from power supply board 202 to enclosure 100.

As shown in FIG. 4B, power supply board 202 may include surface 420 on the opposing side of power supply board 202 from surface 402. Surface 420 may be the surface of power supply board 202 that faces the interior surface of bottom surface 106 shown in FIG. 2, of enclosure 100, and thus faces away from sensor board 206. Heat producing components such as computer automotive network (CAN) transceivers 422 and low dropout regulator 424 may be disposed on surface 402. In general, these heat producing components disposed on surface 420 may generate much more heat than heat producing components disposed on surface 402 of power supply board 202.

Thermal pads 406 may also be disposed on surface 420 over exposed conductive material (not shown), so that thermal pads 406 may conduct the heat from those exposed conductive material to enclosure 100. Thermal pads 406 may also provide enhanced vibration damping of power supply board 202. Surface 402 may also include holes 418 that may be filled with thermal epoxy to connect the exposed conductive material to a ground plane (shown in FIG. 3C) for power supply board 406. Similar to silicon based thermal pads, such as thermal pad 216 shown in FIG. 2B, thermal pads 406 may also be compressed by about 20% near fastening points 408 to optimize heat transfer from power supply board 202 to enclosure 100.

As shown in FIG. 4C, power supply board 202 may include a ground plane 426 between surface 402 and surface 420. Ground plane 426 may be made of copper and may appear as an infinite ground potential to signals. Heat producing components 208 on surface 402 and surface 420 may directly connect to ground, while holes 418 filled with thermal epoxy may connect exposed conductive material on surface 402 and surface 420 to ground plane 426.

Figure 5A:
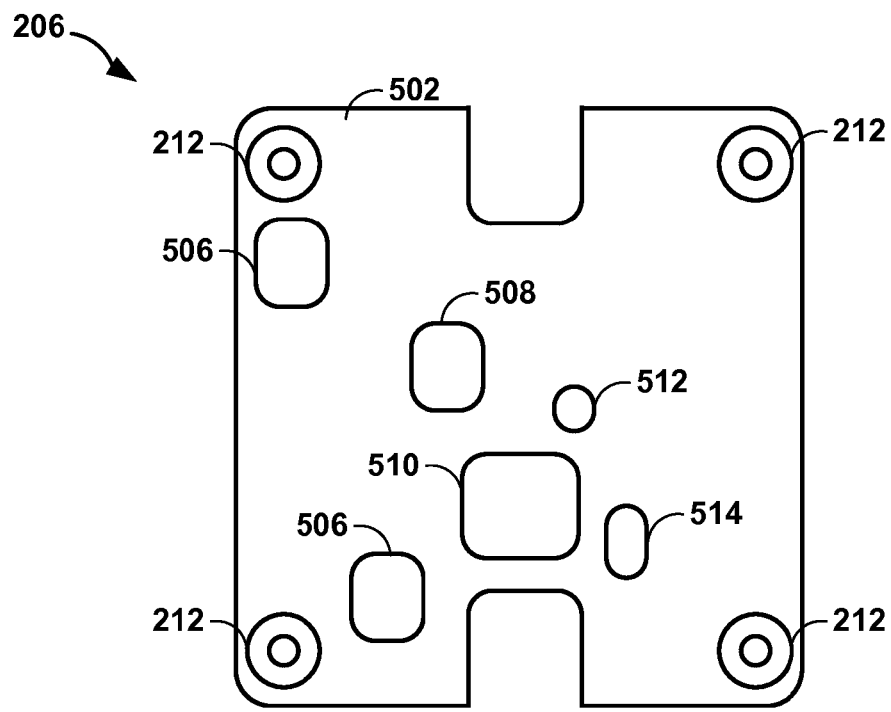
FIGS. 5A-5B are plan views illustrating plan views of an example sensor board according to aspects of the disclosure.
Figure 5B:
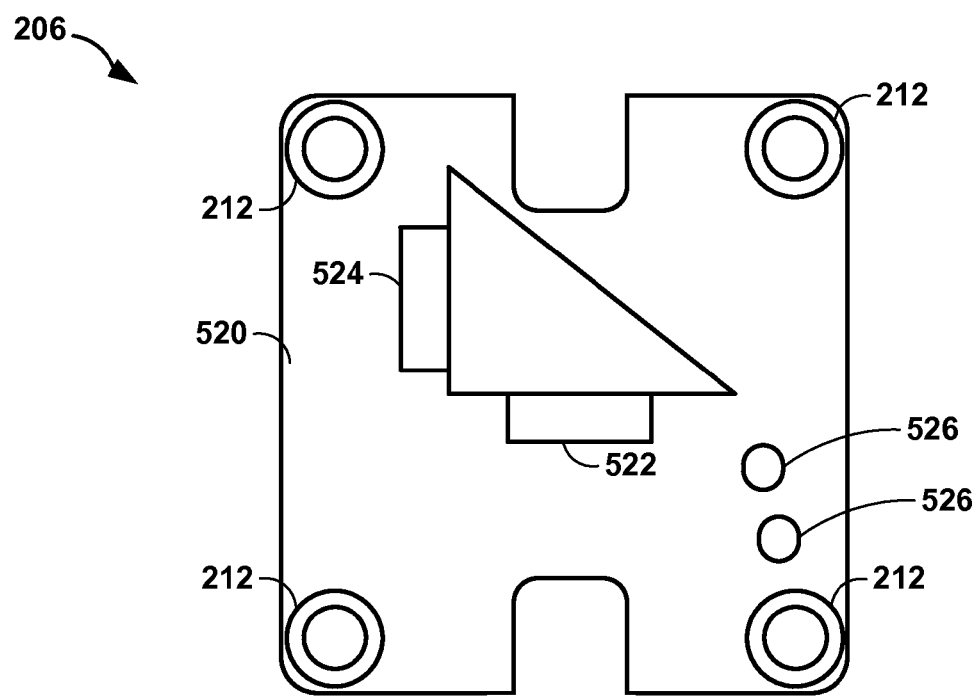

FIGS. 5A-5B illustrate views of an example sensor board according to aspects of the disclosure. As shown in FIG. 5A, one or more heat sensitive components such as magnetometer 506, accelerometer 508, and gyro 510 are disposed on surface 502 of sensor board 206. Surface 502 of sensor board 206 may face towards processor board 204 and therefore faces away from power supply board 202. One or more heat producing components may also be disposed on surface 502 of surface 206. For example, heat producing components such as analog to digital converter 512 and operational amplifier 514 may be disposed on surface 502. Although one or more heat producing components may be operably coupled to sensor board 206, the heat producing components coupled to sensor board 206 may generally produce much less heat than heat producing components coupled to power supply board 202 or processor board 204. The heat producing components and the heat sensitive components may be uniformly spread on sensor board 206.

As shown in FIG. 5B, surface 520 of sensor board 206 is on the opposite side of sensor board 206 from surface 502, and one or more heat sensitive components may also be disposed on surface 520 of sensor board 206. For example, heat sensitive components such as gyroscopes 522 and 524 may be disposed on surface 520. One or more heat producing components may also be disposed on surface 520 of sensor board 206. For example, heat producing components such as low dropout regulator 526 may be disposed orthogonal to surface 520. Surface 520 of sensor board 206 may face towards power supply board 202 and away from processor board 204.

Sensor board 206 may also include dampers 212, such as elastomeric dampers, that are coupled to enclosure 100 to dampen the vibration felt by sensors on sensor board 206 and to further isolate the sensors from heat generating components.

Various aspects of the disclosure have been described. These and other aspects are within the scope of the following claims.

The invention claimed is:

1. A device comprising:
   an anodized and substantially sealed enclosure, the enclosure including an exterior surface and an interior surface from which one or more protrusions project toward an interior of the enclosure, the exterior surface of the enclosure including a plurality of fins;
   a first printed circuit board disposed within the interior of the enclosure;
   one or more first heat producing components conductively coupled to a first surface of the first printed circuit board, the one or more first heat producing components each aligned to thermally couple with one of the one or more protrusions;
   one or more first gap filler thermal pads disposed between the one or more first heat producing components and the one or more protrusions to which it is aligned; and
   one or more heat sensitive components disposed within the interior of the enclosure, wherein the first printed circuit board is between the one or more heat sensitive components and the interior surface of the enclosure.

2. The device of claim 1, wherein the first printed circuit board further comprises:
   a ground plane, wherein the one or more first heat producing components are directly coupled to the ground plane;
   exposed conductive material coupled via thermal epoxy-filled holes to the ground plane; and
   one or more thermal pads, each disposed between the exposed conductive material and one or more of the one or more protrusions projecting from the interior surface of the enclosure.

3. The device of claim 1, wherein the one or more heat sensitive components are on a second surface of the first printed circuit board.

4. The device of claim 1, wherein:
   Each of the protrusions projecting from the interior surface of the enclosure include at least two protrusions of different projecting height; and
   the one or more first gap filler thermal pads are each compressed by about 40% using the at least two protrusions of different projecting height.

5. The device of claim 1, wherein the one or more heat producing components include one or more of a processor and memory.

6. The device of claim 1, wherein the one or more heat sensitive components are conductively coupled to a second printed circuit board within the interior, the second printed circuit board substantially parallel to the first printed circuit board.

7. The device of claim 6, wherein the second printed circuit board is coupled to one or more dampers coupled to the enclosure.

8. The device of claim 6, wherein the one or more heat sensitive components include one or more sensors.

9. The device of claim 8, wherein the one or more sensors include one or more of a gyroscope, an accelerometer, and a magnetometer.

10. The device of claim 1, wherein the interior surface of the enclosure is a first interior surface, the device further comprising:
    one or more second heat producing components conductively coupled to a second printed circuit board within the interior and substantially parallel to the first printed circuit board,
    wherein the one or more second heat producing components are disposed on a first surface of the second printed circuit board facing away from the one or more heat sensitive components and facing towards a second surface of the enclosure.

11. The device of claim 10, further comprising:
    one or more second gap filler thermal pads disposed between the one or more second heat producing components and one or more protrusions projecting from the second interior surface of the enclosure.

12. The device of claim 10, wherein the second printed circuit board further comprises:
    a ground plane, wherein the one or more second heat producing components are directly coupled to the ground plane;
    exposed conductive material coupled via thermal epoxy-filled holes to the ground plane; and
    one or more thermal pads, each disposed between the exposed conductive material and the one or more protrusions projecting from the second interior surface of the enclosure.

13. The device of claim 12, further comprising:
one or more third heat producing components on a second surface of the second printed circuit board opposite the first surface of the second printed circuit board and facing the one or more heat sensitive components,
wherein the one or more third heat producing components produce less heat than the one or more second heat producing components.

14. The device of claim 1, wherein the plurality of fins include a plurality of parabolic-shaped fins.

15. The device of claim 14, wherein:
the enclosure is substantially rectangular in shape;
the plurality of fins are disposed on three or more exterior sides of the enclosure; and
each of the plurality of fins on one of the exterior sides are substantially parallel to each other of the plurality of fins on the same one of the exterior sides.

16. The device of claim 1, further comprising:
the exterior surface of the enclosure is anodized and includes a powder coating; and,
the interior surface of the enclosure is anodized.

17. The device of claim 4, further comprising:
a plurality of first gap filler thermal pads disposed between a first one of the at least two protrusions of different projecting height and the plurality of first heat producing components; and
a plurality of second gap filler thermal pads disposed between a second one of the at least two protrusions of different projecting height and the plurality of second heat producing components.

* * * * *